(12) United States Patent
Sanduleanu et al.

(10) Patent No.: US 7,589,579 B2
(45) Date of Patent: Sep. 15, 2009

(54) MIXER CIRCUIT

(75) Inventors: Mihai A. T. Sanduleanu, Maastricht (NL); Eduard F. Stikvoort, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/911,326

(22) PCT Filed: Apr. 4, 2006

(86) PCT No.: PCT/IB2006/051035

§ 371 (c)(1),
(2), (4) Date: Jun. 4, 2008

(87) PCT Pub. No.: WO2006/109216

PCT Pub. Date: Oct. 19, 2006

(65) Prior Publication Data

US 2008/0284488 A1    Nov. 20, 2008

(30) Foreign Application Priority Data

Apr. 14, 2005    (EP) .................................. 05102935

(51) Int. Cl.
H04B 1/26    (2006.01)
H03K 17/00    (2006.01)

(52) U.S. Cl. ...................... 327/359; 327/355
(58) Field of Classification Search ......... 327/355–359; 455/326, 323, 313, 333
See application file for complete search history.

(56) References Cited

U.S. PATENT DOCUMENTS

| 5,515,014 | A   |   | 5/1996 | Troutman et al. |         |
|-----------|-----|---|--------|-----------------|---------|
| 5,920,810 | A   | * | 7/1999 | Finol et al.    | 455/313 |
| 6,348,830 | B1  |   | 2/2002 | Rebeiz et al.   |         |
| 7,415,261 | B2  | * | 8/2008 | Rosik et al.    | 455/313 |

FOREIGN PATENT DOCUMENTS

EP    0942526 A1    9/1999

* cited by examiner

Primary Examiner—Dinh T. Le

(57) ABSTRACT

A sub-harmonic mixer circuit having an input stage (52) and a current modulating stage (64 is disclosed. The input stage (52) receives an RF input signal (RF+, RF−) at a first frequency and generates output currents (il , i2) varying in dependence upon the Rf input signal. The current modulating stage (64) comprises a first transistor (Q3) for receiving a first local oscillator signal (LO) respective and a second transistor (Q4) for receiving a second local oscillator signal (LO180), 180 degrees out of phase with the first local oscillator signal, such that a modulating current signal (iO), having twice the local oscillator frequency is superimposed onto the output currents.

7 Claims, 5 Drawing Sheets

MIXER CIRCUIT

Present invention relates to mixer circuits.

Mixer circuits are important building blocks in radio frequency (RF) apparatus. They combine input signals at first and second frequencies to generate output signals having components with frequency at the sum of the first and second frequencies and at the difference between the first and second frequencies.

FIG. 1 depicts a monolithic bipolar RF mixer circuit comprising a double-balanced Gilbert mixer. The mixer 2 has a first differential amplifier stage 4 having first and second transistors Q1, Q2 across which a differential local oscillator signal LO+, LO− is applied to adjust the amount of current flowing in load resistors RL, and an output terminal 6 at which a first output voltage IF− is developed. The differential local oscillator signal is also applied to a second differential amplifier stage 8 having third and fourth transistors Q3, Q4, a load resistor RL and an output terminal 10 at which a second output voltage IF+ is developed. The collectors of the second and third transistors Q2, Q3 are connected to the second and first output terminal 10, 6 respectively.

The transconductance of each transistor Q1, Q2, Q3 and Q4 is dependent upon the emitter current of that transistor, which is in turn adjusted by applying a differential radio frequency signal RF+, RF− between fifth and sixth transistors Q5 and Q6, which are located in the tails of the first and second amplifier stages 4, 8 respectively. As a result, the differential voltage signal appearing across the output terminal 6, 10 has a component proportional to the product of the local oscillator signal LO+, LO− and RF signals RF+, RF−. As a result of trigonometric identities, which will be familiar to persons skilled in the art, the differential output signal IF−, IF+ appearing between output terminal 6, 10 has components having frequencies at the sum of the frequencies of the local oscillator and RF frequencies and at the difference between those frequencies. By taking the differential output voltage between output terminal 6, 10, terms other than the sum and difference frequency components are removed from the output signal.

Although the Gilbert cell mixer 2 shown in FIG. 1 can provide a conversion gain, requires relatively low power for driving the local oscillator port, provides a reasonable good isolation between the signal ports, and has no component of the local oscillator signal in the output spectrum, existing so-called fundamental mixers of this type suffer from the disadvantage that at certain frequencies, the local oscillator frequency is sufficiently close to the frequency of the RF signal to present isolation problems between the RF and local oscillator ports. This can lead to undesired local oscillator radiation and receiver front-end desensitisation, which is a particular problem in designing integrated transceivers in relatively high frequency bands as e.g. 60 GHz band.

Subharmonic mixers may be used to solve this problem. Said mixers operate at a local oscillator frequency equal to the analogous fundamental local oscillator frequency divided by an integer. A comparison of the operation of a fundamental mixer and a subharmonic mixer is shown in FIGS. 2 and 3.

Taking the example of a mixer operating in the 60 GHz band, in order to convert a 60 GHz RF signal to a 2 GHz intermediate frequency signal, the appropriate local oscillator frequency for low side injection by means of a fundamental mixer as illustrated in FIG. 2 would need to be 58 GHz. As shown in FIG. 2, the local oscillator signal is very close to the frequency of the RF signal, giving rise to the problems outlined above. In the case of a 4× subharmonic mixer as illustrated in FIG. 3, on the other hand, the intermediate frequency component is obtained as a result of mixing between the RF frequency and the fourth harmonic of the local oscillator signal. In the case of an RF frequency of 60 GHz and an IF frequency of 2 GHz, therefore, a 4× subharmonic mixer will operate at 14.5 GHz using the low side injection. This provides adequate frequency separation between the RF, local oscillator and intermediate frequency signals, facilitating isolation of those frequencies from each other.

An example of a subharmonic mixer is shown in FIG. 4. A pair of diodes 20, 22 is connected in an anti-parallel shunt configuration, with each signal path connected to the same node 24 via respective filters 26, 28, 30. The lower part of FIG. 5 shows the conduction waveform of diode pair 20, 22 resulting from a symmetrical local oscillator voltage waveform as shown in the upper part of FIG. 5. Conduction occurs on both the positive and negative portions of the local oscillator voltage cycle, resulting in two identical conduction pulses for each cycle. In other words, the conduction waveform of the diode pair 20, 22 is at twice the frequency of the local oscillator waveform.

As a result, the anti-parallel diode mixer of FIG. 4 provides rejection of the fundamental mixing mode, which minimises RF power losses at the IF mixing product of the fundamental component of the local oscillator signal. Instead, the lowest frequency component president in the conduction waveform is exactly twice the local oscillator frequency, and the resulting large signal voltage over the diode pair now only contains the second local oscillator harmonic and its multiples. As a consequence, all fundamental and subharmonic mixing products due odd multiples of the local oscillator frequency are suppressed, which results in the conversion of more RF power to subharmonic mixing products resulting from even local oscillator multiples. Consequently, a reduction in subharmonic conversion loss is achieved, by eliminating the unwanted fundamental and odd local oscillator multiple subharmonic conversion products.

However, the mixer of FIG. 4 suffers from the drawback that in order to achieve this, the diodes 20, 22 must have nearly identical I-V characteristics to ensure symmetrical conduction of the diode pair 20, 22. Any asymmetry in diode conduction results in a first local oscillator harmonic frequency component in the conduction waveform, which will then represent the dominant mechanism in degrading the rejection of the fundamental response.

A known transistor-based subharmonic mixer circuit achieving fundamental response rejection is shown in FIG. 6. The mixer 40 comprises two parallel common-drain field effect transistors 42, 44, and the local oscillator signal LO is applied via a filter 46 to the gate of one transistor 46 and fed to the gate of the other transistor 42 via a transmission line 48 with a 180 degree phase delay at the local oscillator frequency. In a manner analogous to the diode-based mixer of FIG. 4, when a symmetrical local oscillator signal is applied to each transistor 42, 44 with a phase difference of 180 degrees, each transistor conducts over half of the local oscillator cycle to provide a waveform similar to that shown in the lower part of FIG. 5. This ensures that the overall conduction waveform created by the local oscillator is symmetrical, i.e. that the circuit conducts on both positive and negative portions of the local oscillator cycle. However, the transmission line 48 determines a loss into the local oscillator signal. This in turn introduces asymmetry into the conduction waveform. The fundamental mode rejection for this subharmonic mixer arrangement is then impaired, and is theoretically worse than that of the antiparallel diode pair diode of FIG. 4.

It is an object of the present invention to provide a subharmonic mixer circuit in which one or more of the above disadvantages is alleviated.

According to the present invention, there is provided a mixer circuit comprising:

at least one input stage for receiving a respective first input voltage signal at a first frequency and generating at least one respective output current varying in dependence upon said first input voltage signal; and at least one respective current modulating stage connected to the or each said input stage for modulating the or each said output current, wherein the or each said current modulating stage comprises at least one transistor pair including a respective first transistor for receiving a respective second input voltage signal, at a second frequency, and a respective second transistor connected to said first transistor for receiving a respective third input voltage signal, substantially 180 degrees out of phase with the corresponding said second input voltage signal, such that said transistor pair superimposes a respective modulating current signal, having substantially twice said second frequency, onto said output current.

Superimposing a modulating current signal having substantially twice said second frequency onto the output current, provides the advantage that the mixing current signal superimposed on the output current can be at a frequency which is a harmonic of the local oscillator fundamental frequency, thus enabling adequate separation of the input signal and local oscillator signal. Also, by providing the modulating current by means of a pair of transistors connected to each other, this provides the advantage that transistors with closely matched I-V characteristics can be manufactured, as a result of which symmetrical behaviour of the transistor pair is maximised. This in turn reduced the extent to which frequency components at the fundamental frequency and odd harmonic frequencies appear in the output signal. The maximum amplitude of at least one said output current may be substantially equal to the maximum amplitude of the or each corresponding said modulating current signal.

At least one said second frequency may be substantially half said first frequency.

This determines minimising the occurrence of local oscillator self-mixing at said second frequency, which in turn minimises an offset generation at the output terminals of the mixer circuit. This determines a lower power consumption for the mixer, the mixer being, in the same time, relatively easier to be manufactured. A further effect is that local oscillator pulling is also minimised.

At least one said input stage may comprise a respective third transistor and a respective fourth transistor connected to said third transistor wherein said third and fourth transistors are adapted to generate respective output currents varying in dependence upon a said first input voltage signal applied between input terminals of said third and fourth transistors.

The mixer circuit may further comprise first and second input stages, wherein an output terminal of a third transistor of said first input stage is connected to an output terminal of a fourth transistor of said second input stage, and wherein an output terminal of a fourth transistor of said first input stage is connected to an output terminal of a third transistor of said second input stage.

This provides the advantage of enabling the difference between output voltages of said first and second input stages to be taken as an output signal, as a result of which one or more signal components at undesired frequencies are absent from the output signal.

The mixer circuit may further comprise respective first and second current modulating stages connected to each of said third and fourth transistors of at least one said input stage.

At least one said input stage may comprise a respective fifth transistor and at least one respective impedance connected to an output terminal of said transistor for receiving a respective said first input voltage signal and applying a current signal to said output terminal in dependence upon said first input voltage signal.

At least one said impedance may comprise a resistance. At least one said impedance may comprise a reactance.

Preferred embodiments of the invention will now be described, by way of example only and not in any limitative sense, with reference to the accompanying drawings, in which.

Figure 1:
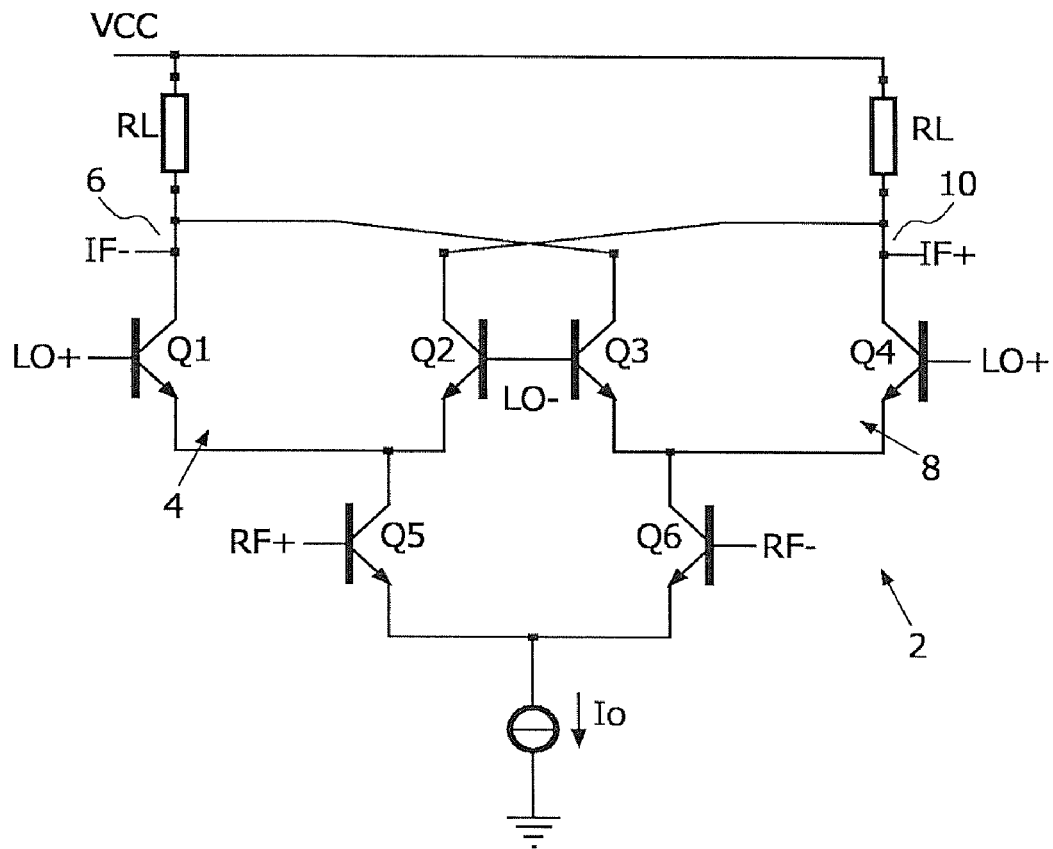
FIG. 1 is a circuit diagram of a known design of monolithic fundamental mixer.
Figures 2, 3:
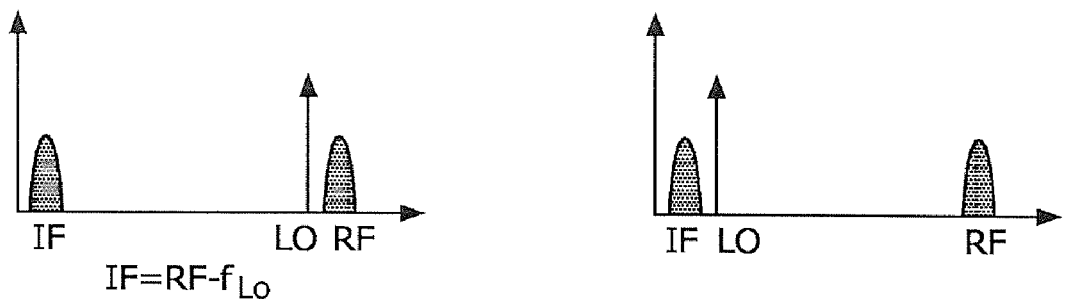
FIG. 2 illustrates the principle of operation of a fundamental mixer.
FIG. 3 illustrates the principle of operation of a subharmonic mixer.
Figure 4:
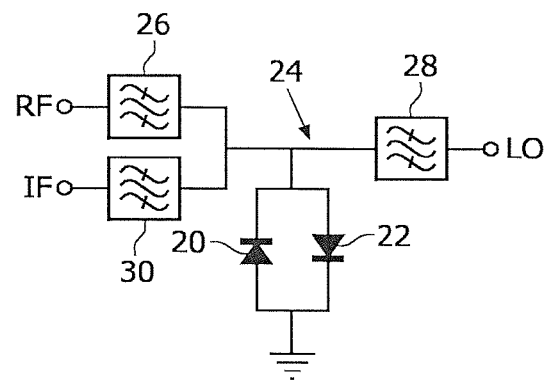
FIG. 4 is a circuit diagram of a known diode-based subharmonic mixer.
Figure 5:
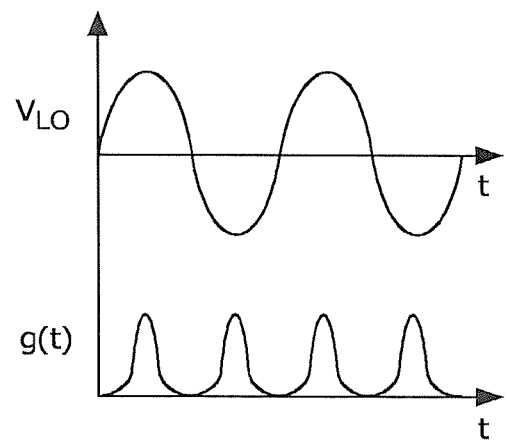
FIG. 5 illustrates the operation of the mixer shown in FIG. 4.
Figure 6:
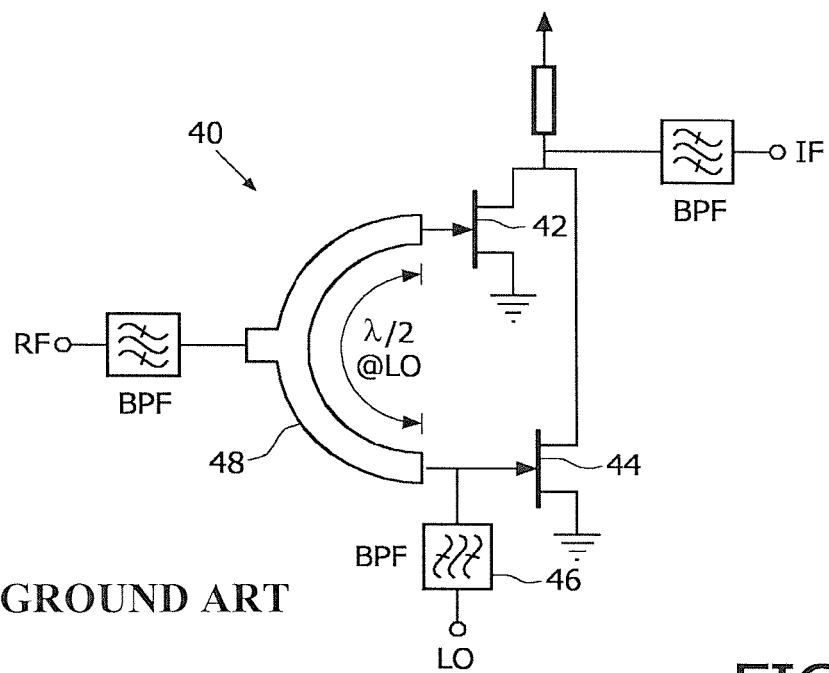
FIG. 6 is a circuit diagram of a known transistor-based subharmonic mixer.
Figure 7:
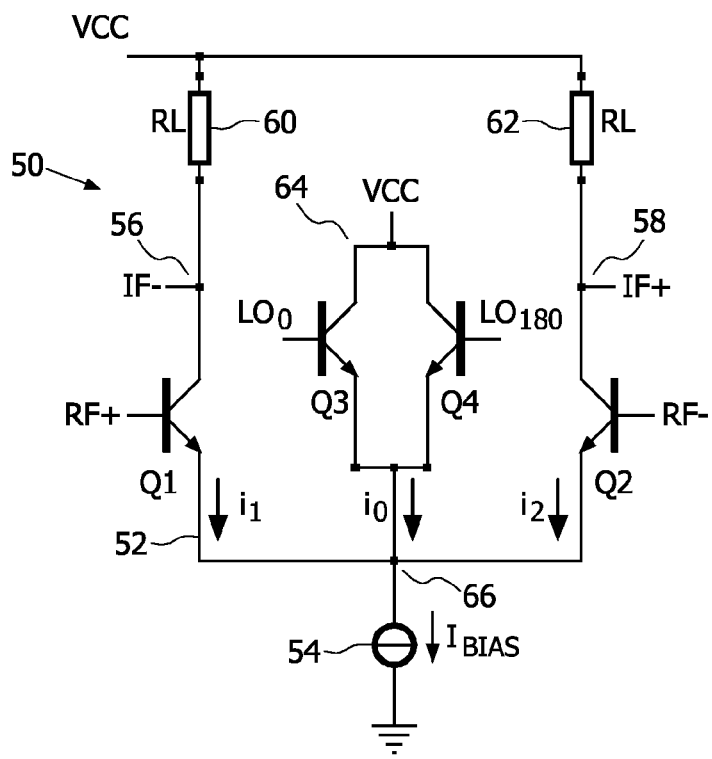
FIG. 7 is a circuit diagram of a subharmonic mixer of a first embodiment of the present invention.
Figure 8:
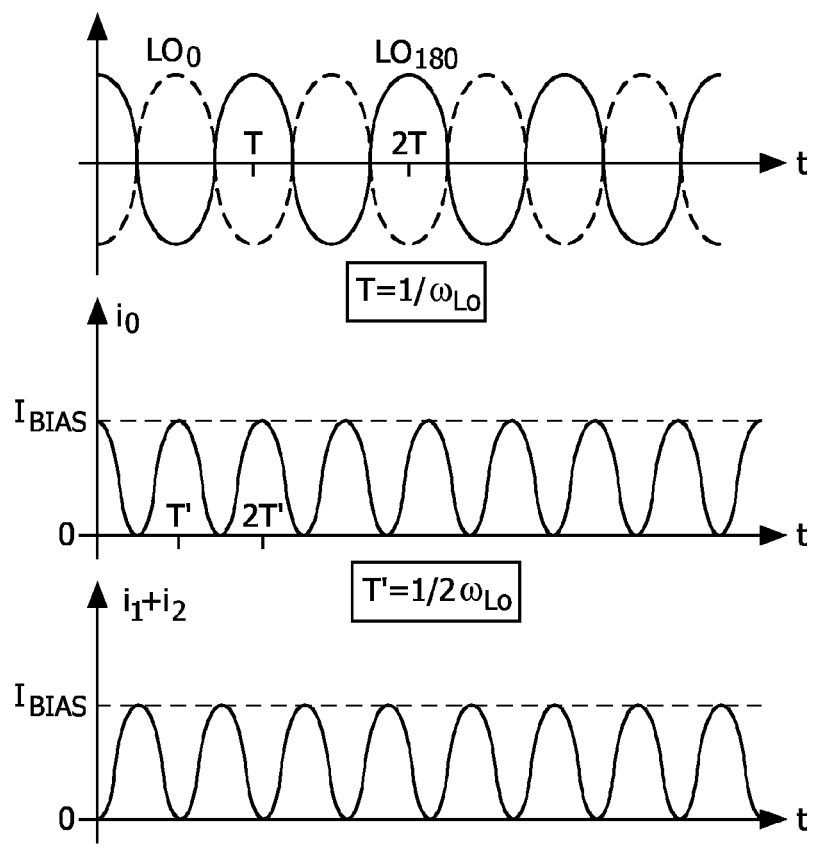
FIG. 8 shows waveform diagrams illustrating the operation of the mixer of FIG. 7.

FIG. 7 is a circuit diagram of a subharmonic mixer. In FIG. 7 a single balanced subharmonic mixer 50 of a first embodiment of the present invention comprises an input stage 52 including a first transistor Q1, a second transistor Q2, and a current source 54 connected to the emitters of each transistor Q1, Q2 and generating a bias current $I_{BIAS}$. An RF input signal RF+, RF− is applied between the bases of transistors Q1, Q2, and the collectors of transistors Q1, Q2 are connected to respective output terminals 56, 58 across which an intermediate frequency signal IF−, IF+ is output. The output terminals 56, 58 are connected to the positive voltage supply $V_{CC}$ by respective resistors 60, 62. A current modulating stage 64 comprises a pair of transistors Q3, Q4, the emitters of which are connected together and to a node 66 connected to the current source 54 and the emitters of transistors Q1, Q2. The collectors of transistors Q3, Q4 are connected to the positive voltage supply $V_{CC}$. A local oscillator signal $LO_0$ having a frequency $f_{LO}$ is applied to the base of transistor Q3, and a second local oscillator signal $LO_{180}$ being 180 degrees out of phase with the first local oscillator signal $LO_0$ is applied to the base of transistor Q4. The transistors Q3, Q4 are matched to have as near identical I-V characteristics as possible to each other, as a result of which transistor Q3 contributes to tail current $i_0$ at node 66 on positive parts of first local oscillator signal $LO_0$ cycle, and transistor Q4 contributes to tail current $i_0$ at positive parts of a second local oscillator signal $LO_{180}$ cycle. Since the positive parts of first and second local oscillator signals $LO_0$, $LO_{180}$ are in anti-phase with each other, the transistors Q3, Q4 conduct generally identical currents at frequency $f_{LO}$ but at parts of the local oscillator cycle 180 degrees out of phase with each other, which results in current $i_0$ having frequency $2f_{LO}$, as shown in FIG. 8.

The maximum amplitude of current $i_0$ is $I_{BIAS}$, and can be seen to have the second harmonic of the local oscillator signal in its spectrum. This can be represented as follows:

$$i_0(t) = \frac{2I_{BIAS}}{\pi} \sum_{k=-\infty}^{\infty} \frac{1}{1-4k^2} * e^{j2k\omega_{LO}t}$$

In effect, the current modulating stage 64 produces a current signal $i_0$ at frequency $2f_{LO}$, the current signal $i_0$ being superimposed on the current signals $i_1$, $i_2$ through the collectors of transistors Q1, Q2 respectively. As a result, the output voltage signals IF-, IF+ appearing at output terminals 56, 58 respectively are dependent upon the product of a signal at frequency $2f_{LO}$ and the at the frequency of the RF signal $f_{RF}$. Mixing occurs as a consequence, to produce an output voltage signal IF-, IF+ between the output terminals 56, 58 having components at the sum and difference of the frequencies $f_{RF}$ and $2f_{LO}$, from which it can be seen that the mixer behaves as a subharmonic mixer having its lowest frequency component at the second harmonic of the local oscillator frequency $f_{LO}$. Because of the matching of the transistors Q3, Q4, the current signal $i_0$ has substantially no component at the fundamental local oscillator frequency $f_{LO}$, as a result of which power dissipation at the mixing product of the fundamental frequency is minimised.

In particular, the $i_0$ current waveform can be treated as a cosine-like waveform, as a result of which the current signal $i_0$ can be written as a harmonic Fourier series:

$$i_0(t) = \frac{2I_{BIAS}}{\pi}\left[1 - 2\sum_{k=1}^{\infty} \frac{1}{4k^2-1} * \cos(2k\omega_{LO}t)\right]$$

At its maximum, the current $i_0$ has a value $I_{BIAS}$, this current starving the differential transistor pair Q1, Q2, as a result of which the RF signal does not pass to the output terminals 56, 58. At its minimum, the current $i_0$ is zero, and the RF signal is sampled at the output terminals. The total tail current flowing in the differential pair Q1, Q2, denoted by $i_1+i_2$, is the difference between $I_{BIAS}$ and $i_0$, i.e.:

$$i_1(t) + i_2(t) = \frac{I_{BIAS}(\pi-2)}{\pi} + 4\frac{I_{BIAS}}{\pi}\sum_{k=1}^{\infty} \frac{1}{4k^2-1} * \cos(2k\omega_{LO}t)$$

As will be appreciated by persons skilled in the art, given that there is a tan h(x) relationship between the IF output voltage and the RF input voltage, the IF output voltage can be expressed as:

$$IF(t) = \left[\begin{array}{c} \frac{(\pi-2)I_{BIAS}R_L}{\pi} + 4\frac{I_{BIAS}R_L}{\pi} \\ \sum_{k=1}^{\infty} \frac{1}{4k^2-1} * \cos(2k\omega_{LO}t) \end{array}\right] \tanh\left(-\frac{RF(t)}{2V_T}\right)$$

This expression can be simplified by the approximation $$\tanh(x) \approx x - \frac{x^3}{3} + \ldots$$

Taking the linear term only, since the extra polynomial terms can be omitted, given the magnitude of RF signals, the IF output signal is therefore is found to have RF feed through in its spectrum:

$$IF(t) \cong -\frac{(\pi-2)I_{BIAS}R_L}{2\pi V_T}RF(t) - 2\frac{I_{BIAS}R_L}{\pi V_T}RF(t)\sum_{k=1}^{\infty} \frac{1}{4k^2-1} * \cos(2k\omega_{LO}t)$$

In other words, the IF output voltage signal has a component at the RF frequency, as well as at the sum and differences of the RF frequency and twice the local oscillator signal. If a harmonic RF signal with phase and amplitude modulation is assumed as follows:

$$RF(t) = A(t)\cos(2\omega_{LO}t + \phi(t))$$

and the RF frequency is assumed to be double the local oscillator frequency, i.e. $f_{RF}=2f_{LO}$, after low pass filtering of the IF signal, the baseband signal is:

$$IF_{LPF}(t) \cong -\frac{I_{BIAS}R_L}{\pi V_T}A(t)\cos(\phi(t))$$

It will be appreciated by persons skilled in the art that the conversion gain/loss of this mixer is:

$$G_{C,single-balanced} = \frac{I_{BIAS}R_L}{\pi V_T}$$

This becomes conversion gain when the DC voltage drop on the load resistors 60, 62 in FIG. 7 is larger than $\pi V_t/2$. It is easy to achieve this condition as a result of the large voltage room provided by this configuration, and voltage drops of few hundreds of millivolts are possible.

It can therefore be seen that the mixer of FIG. 7 operates in a subharmonic mode at half the RF frequency and generates internally double the local oscillator frequency. As a result, this has the advantage the $2f_{LO}$ frequency signal is a common mode signal that cannot disturb the differential RF signal. Keeping the local oscillator at half the RF frequency reduces the possibility of local oscillator self-mixing and therefore local oscillator offset generation at the intermediate frequency IF.

Because the frequency of the local oscillator is half of the RF frequency the occurrence of local oscillator is minimised. This determines that a reduced offset generated at the output terminals of the mixer circuit, which in turn determines a lower power consumption of the mixer circuit. The mixer circuit is relatively easier to be manufactured when compared with known mixers and the local oscillator pulling caused by power amplifiers is also reduced.

Figure 9:
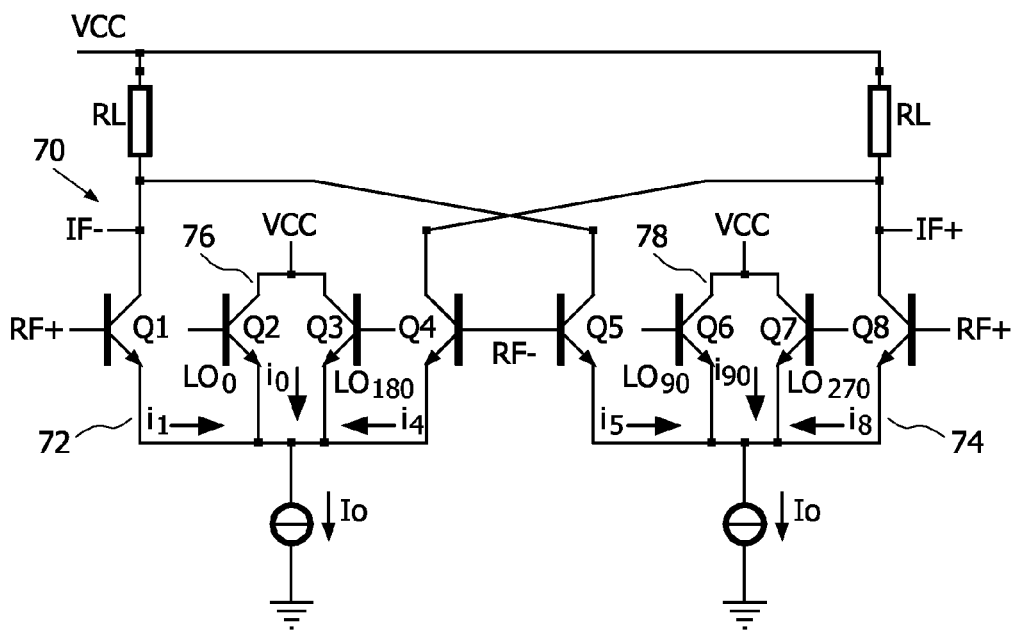
FIG. 9 is a circuit diagram of a subharmonic mixer of a second embodiment of the present invention.
Figure 10:
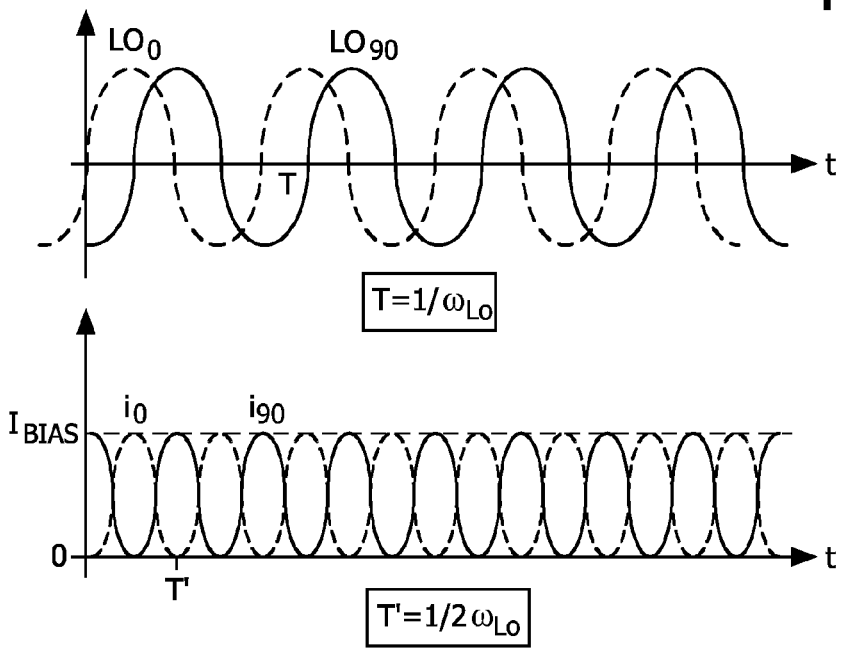
FIG. 10 shows waveforms illustrating the operation of the mixer of FIG. 9.
Figure 10:
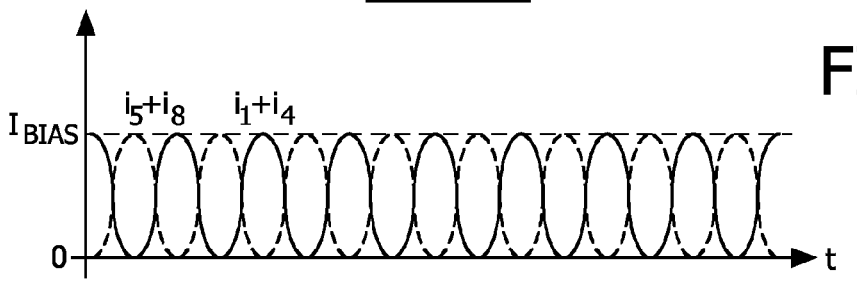

In FIG. 9, a mixer of a second embodiment of the invention is shown. The mixer 70 of FIG. 9 is a double-balanced subharmonic mixer, and its operation is illustrated by means of the waveforms shown in FIG. 10.

The mixer 70 has first and second input stages 72, 74, each of which comprises first transistors Q1, Q8 and second transistors Q4, Q5 respectively. The input RF signal is applied between the bases of transistors Q1, Q4 and between the bases of transistors Q5, Q8. The collectors of transistors Q1 and Q5 are connected together, as are the collectors of transistors Q4 and Q8. Current modulating stages 76, 78 similar to the current modulating stage of the mixer of FIG. 7 are connected to the first and second input stages 72, 74 respectively.

The differential output currents of the differential pairs Q1, Q4 and Q5, Q8 respectively of the mixer of FIG. 9 are as follows:

$$i_{C1}(t) - i_{C4}(t) = \left[ \frac{(\pi-2)I_{BIAS}}{\pi} + 4\frac{I_{BIAS}}{\pi} \sum_{k=1}^{\infty} \frac{1}{4k^2-1} * \cos(2k\omega_{LO}t) \right] \tanh\left(\frac{RF(t)}{2V_T}\right)$$

$$i_{C5}(t) - i_{C8}(t) = \left[ \frac{(\pi-2)I_{BIAS}}{\pi} - 4\frac{I_{BIAS}}{\pi} \sum_{k=1}^{\infty} \frac{1}{4k^2-1} * \cos(2k\omega_{LO}t) \right] \tanh\left(-\frac{RF(t)}{2V_T}\right)$$

As a result, the IF output signal can be deduced as follows:

$$IF(t) = \left[ \frac{(\pi-2)I_{BIAS}R_L}{\pi} + 4\frac{I_{BIAS}R_L}{\pi} \sum_{k=1}^{\infty} \frac{1}{4k^2-1} * \cos(2k\omega_{LO}t) \right]$$

$$\tanh\left(-\frac{RF(t)}{2V_T}\right) + \left[ \frac{(\pi-2)I_{BIAS}R_L}{\pi} - 4\frac{I_{BIAS}R_L}{\pi} \sum_{k=1}^{\infty} \frac{1}{4k^2-1} * \cos(2k\omega_{LO}t) \right] \tanh\left(\frac{RF(t)}{2V_T}\right)$$

It will be appreciated by persons skilled in the art that after approximation of the tan h term denoting the relationship between the IF output voltage and the RF input voltage, this gives:

$$IF(t) = -4 * RF(t) \frac{I_{BIAS}R_L}{\pi V_T} \sum_{k=1}^{\infty} \frac{1}{4k^2-1} * \cos(2k\omega_{LO}t)$$

It can therefore be seen that the mixer of FIG. 9 has the advantage that there is no LO or RF signal in the output spectrum. This is particularly advantageous for many applications where the RF or LO signal is close to the IF signal and filtering of the LO or RF signal at the output is not practical as a result of filter requirements. After low pass filtering and selecting only the terms that fall around 0 Hz, it is found that:

$$IF_{LPF}(t) \cong -2\frac{I_{BIAS}R_L}{\pi V_T} A(t)\cos(\phi(t))$$

The conversion gain for the double-balanced subharmonic mixer of FIG. 9 is:

$$G_{C,double-balanced} = 2\frac{I_{BIAS}R_L}{\pi V_T}$$

As a result, the conversion gain of the double-balanced mixer is a factor 2 larger than the conversion gain of the single balanced mixer of FIG. 7.

Figure 11:
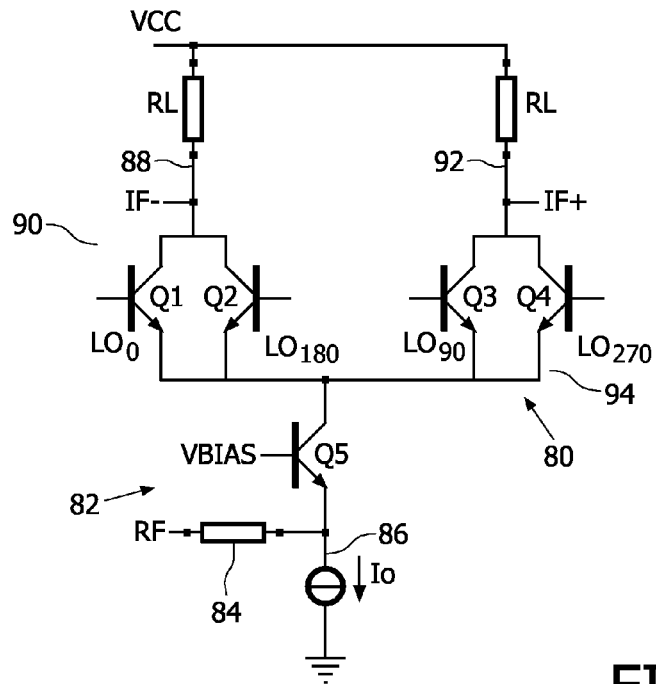
FIG. 11 is a circuit diagram of a subharmonic mixer of a third embodiment of the present invention.

A single-balanced mixer of a third embodiment of the present invention is shown in FIG. 11. The mixer 80 includes an input stage comprising a transistor Q5 and a resistor connected between the emitter of transistor Q5 and a current source 86. The resistor 84 acts as a voltage to current converter and assists impedance matching. The resistor 84 can be replaced by reactive components such as coils.

The collector of transistor Q5 is connected to a first output terminal 88 via a first current modulating stage 90 having a pair of transistors Q1 and Q2, and is connected to a second output terminal 92 via a second current modulating stage 94 having transistor pair Q3, Q4. The current modulating stages 90, 94 apply respective current signals at frequency $2f_{LO}$ to the current flowing through the respective output terminals 88, 92, which is also dependent upon the RF input signal applied to the resistor 84. As a result, the current flowing through each output terminal 88, 92 is dependent upon the product of a signal having frequency $f_{RF}$ and frequency $2F_{LO}$, as a result of which subharmonic mixing occurs.

Figure 12:
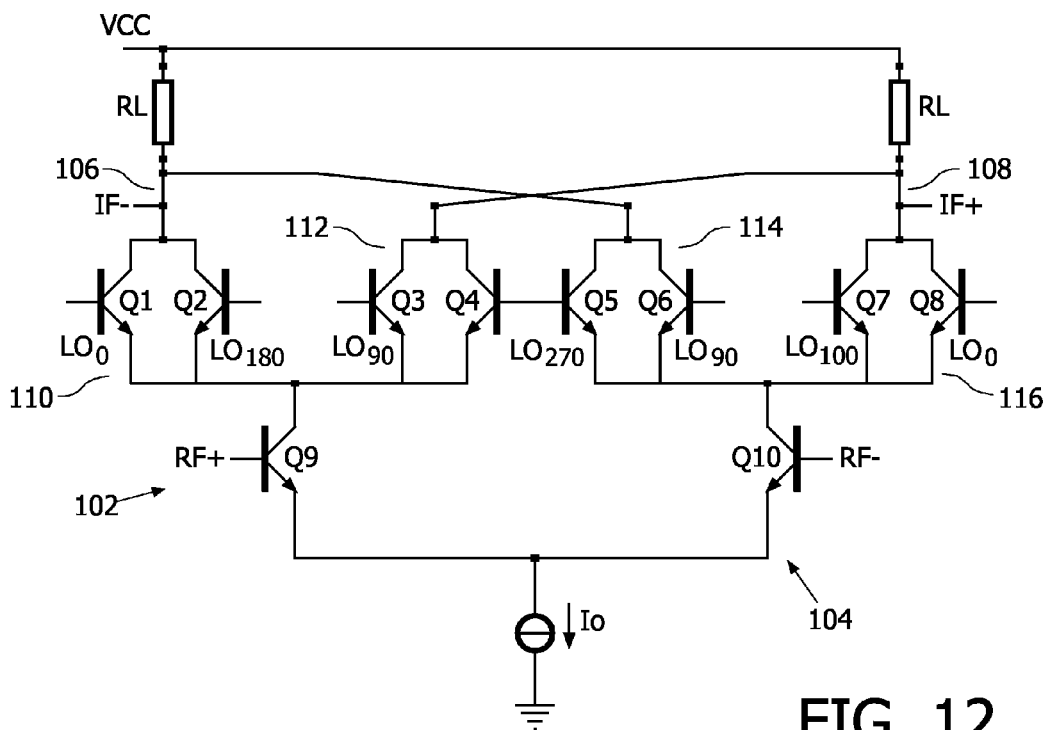
FIG. 12 is a circuit diagram of a subharmonic mixer of a fourth embodiment of the present invention.

Referring to FIG. 12, a double-balanced subharmonic mixer of a fourth embodiment of the present invention is shown. The mixer 102 includes an input stage 104 comprising a transistor pair Q9, Q10 across which the radio frequency input signal is applied. The collector of transistor Q9 is connected to output terminals 106, 108 via respective current modulating stages 110, 112, and the collector of transistor Q10 is connected to the output terminals 106, 108 via respective current modulating stages 114, 116. The current modulating stages 110, 112, 114, 116 are of similar construction to the current modulating stage of the mixer of FIG. 7, the signals applied to the transistors of each current modulating stage being 180 degrees out of phase with each other. As a result, a current signal at twice the local oscillator frequency is superimposed on the current flowing through each output terminal 106, 108 so that subharmonic mixing occurs at double the fundamental frequency of the local oscillator.

It will be appreciated by persons skilled in the art that the above embodiments have been described by way of example only, and not in any limitative sense, and that various alterations and modifications are possible without departure from the scope of the invention as defined by the appended claims.

The invention claimed is:

1. A mixer circuit comprising:
a first input stage that receives a first input voltage signal at a first frequency and generates a first output current varying in dependence upon said first input voltage signal, the first input stage comprising a first transistor and a second transistor connected to said first transistor, wherein the first input voltage signal is applied to bases of the first transistor and the second transistor;
a second input stage that receives the first input voltage signal at the first frequency and generates a second output current varying in dependence upon the first input voltage signal, the second input stage comprising a third transistor and a fourth transistor connected to said third transistor, wherein the first input voltage signal is applied to bases of the third transistor and the fourth transistor; and a first current modulating stage connected to the first input stage to modulate the first output current, wherein the first current modulating stage comprises:
  a fifth transistor that receives a second input voltage signal at a second frequency, and
  a sixth transistor connected to said fifth transistor that receives a third input voltage signal, substantially 180 degrees out of phase with the second input voltage signal to superimpose a first modulating current signal, having substantially twice said second frequency, onto said first output current; and a second current modulating stage connected to the second input stage to modulate the second output current, wherein the second current modulating stage comprises:
  a seventh transistor that receives a fourth input voltage signal at a second frequency, and
  an eighth transistor connected to the seventh transistor that receives a fifth input voltage signal, substantially 180 degrees out of phase with the fourth input voltage signal to superimpose a second modulating current signal, having substantially twice said second frequency, onto the second output current.

2. The mixer circuit according to claim 1, wherein maximum amplitudes of the first and second output currents are substantially equal to maximum amplitudes of the first and second modulating currents.

3. The mixer circuit according to claim 1, wherein said second frequency is substantially half said first frequency.

4. The mixer circuit according to claim 1, wherein a collector of the first transistor of said first input stage is connected to a collector of the fourth transistor of said second input stage, and wherein a collector of the second transistor of said first input stage is connected to a collector of the third transistor of said second input stage.

5. The mixer circuit according to claim 1, wherein each input stage comprises a respective ninth transistor and a respective impedance connected to an output terminal of said respective ninth transistor to receive the first input voltage signal and to apply a respective current signal to each output current in dependence upon said first input voltage signal.

6. The mixer circuit according to claim 5, wherein at least one said impedance comprises a resistance.

7. The mixer circuit according to claim 5, wherein at least one said impedance comprises a reactance.

* * * * *